United States Patent [19]

Halecky et al.

[11] Patent Number: 4,474,838

[45] Date of Patent: Oct. 2, 1984

[54] ELECTROLESS DIRECT DEPOSITION OF GOLD ON METALLIZED CERAMICS

[75] Inventors: Alan A. Halecky, Bayonne; Mohamed F. El-Shazly, Bloomfield, both of N.J.

[73] Assignee: OMI International Corporation, Warren, Mich.

[21] Appl. No.: 445,126

[22] Filed: Dec. 1, 1982

[51] Int. Cl.$^3$ ................................................. C23C 3/02
[52] U.S. Cl. .................................... 427/436; 106/1.23; 427/98; 427/437; 427/443.1
[58] Field of Search ............. 427/436, 98, 437, 443.1; 106/1.23; 204/46 G

[56] References Cited

U.S. PATENT DOCUMENTS 2,654,702 10/1953 De Long .......................... 204/46 R
3,862,850  1/1975 Trueblood ......................... 427/437
4,337,091  6/1982 El-Shazly .......................... 106/1.23
4,352,690 10/1982 Dettke ............................... 427/437

Primary Examiner—John D. Smith
Attorney, Agent, or Firm—Richard P. Mueller

[57] ABSTRACT

Electroless gold plating baths for plating metallized ceramics wherein the bath comprises (a) alkali metal gold cyanide, (b) alkali metal fluoride, and (c) alkali metal hydroxide. The baths may optionally contain a buffering agent and/or ammonium hydroxide and/or an organic chelating agent. The metallized ceramics contain tungsten, molybdenum, electroless nickel, copper and the like. The gold constituent in the alkali metal gold cyanide may be monovalent, trivalent or mixtures thereof. The method of utilizing such electroless or autocatalytic plating baths is also described and claimed.

12 Claims, No Drawings

ELECTROLESS DIRECT DEPOSITION OF GOLD ON METALLIZED CERAMICS

FIELD OF THE INVENTION

The present invention relates to the electroless or direct chemical deposition of gold on metallized ceramic substrates; and more particularly to the use of a special electroless plating bath for directly depositing gold on metallized ceramic substrates which have not been extensively pretreated or preactivated.

BACKGROUND OF THE INVENTION

As disclosed in U.S. Pat. No. 4,337,091 to El-Shazly and Baker, a substantial body of literature has developed in recent years pertaining to the electroless or autocatalytic deposition of gold on surfaces, both metallic and non-metallic. As to the treatment of non-metallic surfaces, e.g., glass, it has been essential to subject the substrate to extensive precleaning followed by a special activation treatment prior to the gold plating operation. See, for example, U.S. Pat. No. 4,091,128 to Franz and Vanek where gold is being plated on glass and the pre-cleaning and activation treatments are required and described in great detail. Particular reference is made to the prior patents to Miller: U.S. Pat. Nos. 3,457,138 and 3,723,158. Precleaning and activation treatments are also prescribed in U.S. Pat. No. 4,162,337 to D'Asaro and Okinaka which pertains to a process for making III–V semiconductor devices with electroless gold plated layers. A wide variety of precleaning methods can be employed. This step generally involves removing oxide contaminants from the surface of the substrate. Various mechanical means, i.e. rubbing the surface, and chemical means, i.e. acid rinses have been proposed and are disclosed in the Franz et al. and D'Asaro patents referred to above.

Surfaces of non-metallic substrates, have been rendered catalytically active by producing a film of catalytic particles thereon. This may be done by the method described in U.S. Pat. No. 3,589,916 upon such surfaces as glass, ceramics, various plastics, etc. When a plastic substrate was plated, it was initially etched, preferably in a solution of chromic and sulfuric acid. After rinsing, the substrate was immersed in an acidic solution of stannous chloride, such as stannous chloride and hydrochloric acid, rinsed with water and then contacted with an acid solution of a precious metal, such as paladium chloride in hydrochloric acid. The now catalytically active non-metallic substrate was subsequently contacted with the electroless plating solutions. When the substrate to be gold plated is a metallized ceramic utilizing, for example, tungsten, molybdenum, electroless nickel, and copper substrates, severe pretreatments such as sintering at high temperatures in a reducing atmosphere have been prescribed. Attention is directed to the article entitled "Electroplating of Gold and Rhodium" by Levy, Arnold and Ma in Plating and Surface Finishing, pages 104–107 (May, 1981). The author's set forth details concerning various procedures for pre-treatment of the molybdenum substrate.

U.S. Pat. No. 3,862,850 to Trueblood deals with electroless gold plating of refractory metals, including wherein powders of the refractory metals are sintered to ceramic insulators and subsequently gold plated to allow their brazing to metal members or in certain electronic operations the refractory powders overplated with gold act as electrical conductors on ceramic substrates. The plating of tungsten metallized ceramic circuit boards is illustrated in column 3, while the gold plating of molybdenum metal is illustrated in column 4. In each instance, however, Trueblood requires an elaborate precleaning, also referred to as an activation treatment, that requires soaking the metal in a hot alkaline descaler, rinsing in deionized water, further rinsing in hot dilute acid solution, and then a final rinsing step using boiling deionized water.

Trueblood's electroless gold plating bath consists essentially of (1) water, (2) potassium or sodium gold cyanide, (3) organic chelating agent, (4) non-ammonical alkali metal salt of a weak acid, and (5) a non-ammonical alkali metal hydroxide.

It obviously would be advantageous to minimize the extensive pretreatment requirements and to avoid the need of a special activation treatment which is generally employed after precleaning in the prior art processes.

OBJECTS OF THE INVENTION

One object of the present invention is to provde an electroless gold plating bath for use in plating metallized ceramics and other metal substrates such as copper and palladium and nickel which avoids the problems and disadvantages of the baths heretofore proposed.

Another object of the present invention is to provide an electroless gold plating bath which will directly deposit gold on metallized ceramic substrates without extensive pretreatment of the substrate surface.

A further object of the present invention is to provide an electroless gold plating bath and process for utilizing the same for directly depositing gold on metallized ceramic substrates without requiring preactivation of the substrate surface.

These and other objects will become readily apparent from the following description of the invention.

SUMMARY OF THE INVENTION

In accordance with the present invention, a unique electroless gold plating bath and gold plating process for metallized ceramics can be achieved by utilizing a gold plating bath matrix comprising an alkali metal gold cyanide, an alkali metal fluoride and an alkali metal hydroxide. If desired, the bath matrix may also contain an alkaline buffering agent to ensure that the optimum pH of the bath is maintained during the plating operations, as well as a chelating agent to provide additional chelating capacity.

For some purposes, it was found advantageous to subject the metallized ceramic substrates to treatment with a concentrated alkali metal hydroxide, e.g. sodium hydroxide, prior to immersion in electroless gold plating bath. However, neither the prior art's acid and rinsing intermediate treatments are necessary.

In contrast to some of the more recent developments in the electroless gold plating bath art, it has been found that monovalent gold as well as trivalent gold or mixtures thereof may be effectively used in the practice of the present invention.

It has been found further that the electroless gold plating baths of this invention will have a broader applicability for plating various metallized ceramic substrates provided that ammonium hydroxide in incorporated in the bath.

The gold plating baths of the invention will generally be at a pH ranging from about 11 to 14, preferably from 12 to 14. Components of the bath used to obtain and maintain the desired pH include the alkali metal hydroxide and, when employed, a buffering agent such as an alkali metal tartarate.

For most operations the electroless plating bath of the present invention will be operated at a plating temperature in the range of from about 70° to 105° C., and preferably from about 80° to 100° C.

The metallized ceramic substrates will preferably have metals selected from the group consisting of tungsten, molybdenum, electroless nickel, and electroplated nickel. It will be understood, however, that other metals can be used instead or be present in the metallized ceramics.

In accordance with another aspect of the present invention, an improved method of gold plating metallized ceramic substrates is provided, which were either difficult of impossible to achieve in such a direct manner or in the absence of extensive pretreatments of the surface of the metallized ceramics.

DETAILED DESCRIPTION OF THE INVENTION

As previously described, one of the essential features of the present invention is the formulation of a special aqueous electroless gold plating bath containing (a) alkali metal gold (mono or trivalent) cyanides; (b) alkali metal fluoride, and (c) an alkaline agent such as an alkali metal hydroxide. The bath may also contain a buffering agent, and/or ammonium hydroxide, and/or an organic chelating agent.

It will be understood that the alkali metal gold (mono or trivalent) cyanides employed in the practive of this invention are water-soluble. Although alkali metal auricyanides, alkali metal aurocyanides or mixtures thereof can be employed, the use of gold (III) is especially preferred. For most purposes, the alkali metal is either potassium or sodium, and the use of potassium is especially preferred.

When both trivalent and monovalent gold cyanides are present the weight ratios of the trivalent to monovalent gold will generally range from about 1:1 to 1:3.

The exact function of the alkali metal fluoride component is not fully understood at this time, but it is believed that, at least to some extent, the presence of the fluoride ions is essential in order to achieve the desired adhesion of the gold deposit on to the metallized ceramic substrate, which may come in various compositions.

As set forth the preferred metallic components of the metallized ceramics are tungsten, molybdenum, electroless nickel, copper. Palladium metal also can be used in metallized ceramics.

The electroless gold plating baths of the present invention should be maintained at a pH of about 12 to 14, in order to achieve the desired results. It is thus preferred that an alkaline material such as an alkali metal hydroxide, e.g. sodium or potassium hydroxide, be employed to maintain the pH at this level. Control of the pH is considerably easier to maintain when alkali metal buffering salts are employed in addition to the alkali metal hydroxide.

Suitable alkali metal buffering salts include the alkali metal phosphates, citrates, tartrates, borates, metaborates, etc. Specifically, the alkali metal buffering salts may include sodium or potassium phosphate, potassium pyrophosphate, sodium or potassum citrate, sodium potassium tartrate, sodium or potassium borate, sodium or potassium metaborate, etc. The preferred alkali metal buffering salts are sodium or potassium citrate and sodium or potassium tartrate.

In order to improve further the electroless plating baths of this invention, it is desirable in some instances to provide further chelating capacity by the addition of an organic chelating agent such as ethylenediamine tetraacetic acid, and the di-sodium, tri-sodium and tetra-sodium and potassium salts of ethylenediamine tetraacetic acid, di-ethylene triamine pentatcetic acid, nitilotriacetic acid. The ethylenediamine tetraacetic acid, and its di-, tri-, and tetrasodium salts are the preferred chelating agents, with the tri- and tetra-sodium salts being particularly preferred.

Although the present electroless plating baths are particularly effective for the deposition of gold on ceramic substrates metallized with tungsten, they are also suitable for the gold plating of other metallized ceramic substrates, as indicated above. When such other metallized substrates, and particularly substrates metallized with electroless nickel, are to be plated, it has been found to be desirable to also include ammonium hydroxide in the plating bath. In such instances, the amount of ammonium hydroxide used will be at least about 1 gram/liter.

The components of the electroless plating bath will be present in amounts within the following ranges:

| Components | Amounts, grams/liter | |
| --- | --- | --- |
| | Typical | Preferred |
| (1) Gold as the alkali metal auricyanide or aurocyanide | 1–10 | 4–6 |
| (2) Alkali metal Fluoride | 5–40 | 10–30 |
| (3) Alkaline Agent | 10–80 | 20–60 |
| (4) Organic Chelating agent (when present) | 10–40 | 15–30 |
| (5) Buffering agent, as alkali metal salt (when present) | 10–50 | 20–40 |
| (6) Ammonium hydroxide | 1–80 | 20–60 |
| (7) Water | to make 1 liter | |

As previously set forth, the pH of the bath is maintained at a range of about 11 to 14, and preferably between about 12 to 14. The typical operational termperature during plating is from about 70° to 105° C., preferably from about 80° to 100° C. For most purposes, the plating rates will be at least about 1 micron per 10 minutes.

The method of utilizing the present invention involves primarily the immersion of the metallized ceramic substrates into the electroless plating baths. These baths are maintained at the pH described above, while the plating is carried out at the aforementioned temperatures. Commercially desirable thicknesses of gold metal deposits have been achieved without the need for extensive pretreatment including surface activation. The necessary adhesion characteristics were also readily achieved by the practice of the present invention.

Gernally, the baths of the present invention will be utilized without replenishment of the components, except for adjustment of the pH. As is common practice, the baths as originally formulated, will be used until the gold content has been depleted to a level at which an acceptable gold plate is no longer obtained. Thereafter, the old bath will be replaced by a new bath, formulated to contain the desired amounts of the components.

DESCRIPTION OF THE PREFERRED EMBODIMENTS

The invention will be more fully understood by reference to the following illustrative embodiments.

EXAMPLE I

An aqueous electroless plating bath was formulated from the ingredients set forth below:

| Ingredients | Amount, g/l |
|---|---|
| Gold, as $KAu(CN)_2$; $KAu(CN)_4$ (1:1) | 4 |
| Potassium Fluoride | 10 |
| Potassium Hydroxide | 50 |
| Disodium EDTA | 20 |
| Water | to make 1 liter |

The pH of the resulting bath was about 11 to 12.

Initially the tungsten metallized substrate was subject to a quick cleaning treatment involving immersion for one minute in a hot caustic solution.

The bath was used to plate gold on tungsten metallized ceramics at 85° C. The plating rate was 4–5 microns per ten minutes of plating time. Deposits from this bath were ductile, lemon yellow, pure gold with excellent adhesion to the substrates.

EXAMPLE II

An aqueous electroless plating bath was formulated as follows:

| Ingredients | Amount g/l |
|---|---|
| Gold, as $KAu(CN)_4$ | 6 |
| Sodium Fluoride | 26 |
| Ammonium Hydroxide | 30 |
| Potassium Hydroxide | 50 |
| Sodium Tartrate | 30 |
| Disodium EDTA | 30 |
| Water | to make 1 liter |

Deposits were obtained on electroless nickel metallized ceramics at a plating rate of 3 to 4 microns per 10 minutes of plating time with the bath at a pH of 13.14 and a temperature of 90° C. Again the deposits of gold were lemon yellow in color and with excellent adhesion.

The above data show that the improved electroless gold baths of this invention lead to excellent results and avoid the problems or the commercial disadvantages associated with the previously proposed electroless gold metal baths for metallized ceramics.

In some instances it has been found desirable to briefly treat metallized ceramic substrates with concentration alkali hydroxide solution prior to immersion in the bath. However, even with such a treatment neither acid treatment nor rinsing is required as intermediate steps.

It will be further understood that the foregoing examples are illustrative only and that variations and modifications may be made without departing from the scope of the invention.

What is claimed is:

1. An electroless plating method for plating gold on a non-activated metallized ceramic substrate which comprises immersing said substrate in a gold plating bath which comprises (a) alkali metal gold cyanide, (b) alkali metal fluoride, and (c) alkali metal hydroxide and maintaining the substrate in said bath, without the passage of electric current therethrough, for a period of time sufficient to deposit directly the desired amount of gold thereon.

2. The process of claim 1 in which the electroless gold plating bath has a pH within the range of 11 to 14.

3. The process of claim 1 wherein the gold in the alkali metal gold cyanide is trivalent, monovalent or a mixture thereof.

4. The process of claim 3 wherein the gold is a mixture of trivalent and monovalent gold in which the weight ratio of trivalent gold:monovalent gold is 1:1–3.

5. The process of claim 1 wherein the electroless gold plating bath contains a buffering agent selected from the group consisting of an alkali metal tartrate, phosphate, citrate, borate, metaborate, and mixtures thereof.

6. The process of claim 1 wherein the electroless gold plating bath contains ammonium hydroxide.

7. The process of claim 1 wherein the electroless gold plating bath contains an organic chelating agent.

8. The process of claim 1 wherein the electroless gold plating bath has a pH of from about 12 to 14 and comprising the following:

| Component | Amount, g/l |
|---|---|
| (a) alkali metal gold cyanide | 1–10 |
| (b) alkali metal fluoride | 5–40 |
| (c) alkali metal hydroxide | 10–80 |
| (d) chelating agent (when present) | 10–40 |
| (e) buffering agent | 10–50 |
| (f) ammonium hydroxide (when present) | 1–18 |

9. The process of claim 3 wherein the alkali metal gold cyanide is potassium auricyanide.

10. The process of claim 3 wherein the alkali metal cyanide is potassium aurocyanide.

11. The process of claim 1 wherein the alkali metal fluoride is potassium or sodium fluoride.

12. The process of claim 1 wherein the alkali metal hydroxide is potassium or sodium hydroxide.

* * * * *